(12) United States Patent
Rafi et al.

(10) Patent No.: US 6,580,575 B1
(45) Date of Patent: Jun. 17, 2003

(54) PROCESS AND TEMPERATURE RESISTANT ACTIVE DAMPING CIRCUIT FOR INDUCTIVE WRITE DRIVERS

(75) Inventors: Aslamali A. Rafi, Pittsburgh, PA (US); Bryan E. Bloodworth, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/447,510

(22) Filed: Nov. 23, 1999

(51) Int. Cl.⁷ ............................................. G11B 5/09
(52) U.S. Cl. ........................ 360/66; 360/67; 360/46
(58) Field of Search ............... 360/66, 46, 67, 360/68

(56) References Cited

U.S. PATENT DOCUMENTS 5,822,141 A * 10/1998 Chung et al. ............... 360/46

* cited by examiner

Primary Examiner—Regina N. Holder
Assistant Examiner—Varsha A. Kapadia
(74) Attorney, Agent, or Firm—W. Daniel Swayze, Jr.; W. James Brady; Frederick J. Telecky, Jr.

(57) ABSTRACT

An active damping circuit including an H-bridge circuit having an inductive load and a switching circuit, an impedance circuit responsive to a bias signal to damp the H-bridge circuit, and a bias circuit to generate the bias signal responsive to the voltage drop across the H-bridge circuit.

8 Claims, 6 Drawing Sheets

PROCESS AND TEMPERATURE RESISTANT ACTIVE DAMPING CIRCUIT FOR INDUCTIVE WRITE DRIVERS

FIELD OF THE INVENTION

The present invention relates to an active damping network, and more particularly to an active damping network for damping ringing effects, and more particularly for undershoot in a write circuit for a disk drive.

BACKGROUND OF THE INVENTION

Disk drives are employed to store large amounts of information in bits encoded on tracks on the disk in a series of logical 1's and 0's. These logical 1's and 0's are represented in bit cells, which are areas of uniform size along the length of the tracks on the disk. It is desirable that the information bits be encoded on the disk as densely as practical so that a maximum amount of information may be stored. This can be achieved by increasing bit cell density on the disk, namely by reducing the size of bit cells along a particular track, thereby increasing the number of bit cells on the track. Increasing the number of bit cells per track increases the number of bits that can be encoded on each track, and therefore increases the amount of information stored.

Conventionally, logical 1's are recorded as transitions in magnetic flux on a magnetic disk for a given bit cell, and the absence of a transition indicates a logical 0. These transitions are created by switching the write current polarity through the write head. Transitions representing logical 1's are preferably placed within each bit cell near the center of the bit cell so that the data frequency (based on bit cell size and rotational speed of the disk) can be accurately locked by a phase-locked loop during recovery of data from the disk and to ensure that bits are not encoded over a bit cell boundary during write operations. As bit cells are more densely packed on the track, placement of the transitions becomes even more important and difficult to precisely control. Thus, transition placement accuracy and bit cell density are two very important parameters in a write circuit for a disk drive.

Due to the inductive nature of a write circuit head and the output capacitances associated with the write circuitry, ringing effects occur in the write current signal which tend to delay the settling of the write current to its final DC value. These ringing effects adversely affect both transition placement and bit cell size concerns. One option when ringing effects are present is to simply wait for the write current to settle to its final DC value and then enable the next transition for encoding a bit. This option means that bit cell duration must be increased to allow time for the write current to settle. While the accuracy of transition placement within bit cells in such a system will not be negatively affected by the ringing of the write current, the density of bit encoding by the write circuit is poor in comparison to desired goals. Another option when ringing effects are present is to switch the write current before it has settled to its final value. This approach maintains acceptable encoding density but results in decreased placement accuracy of bit encoding and hinders subsequent recovery of data from the disk. More particularly, if the write current has not fully settled from a prior transition, switching for the next transition might commence at totally different, uncontrolled, current levels, which results in sporadic placement of transitions in bit cells. Therefore, both options entail undesirable performance trade-offs where ringing effects are present.

One known solution to the ringing problem has been to connect a damping resistor across the terminals of the write head. The resistive damping reduces the settling time for the write current signal flowing through the head. However, resistive damping has several negative effects on the performance of the write circuit. Since some of the write current is diverted through the damping resistor, write current through the head is reduced. To achieve the desired value of write current through the head, more current must be generated to flow through both the head and the damping resistor. More importantly, the damping resistor slows the rise time for write current transitions. This can adversely affect bit cell density. While resistive damping does reduce settling time, the slower rise times may not be acceptable for high performance write circuits. Undershoot may also occur, which could result in loss of saturation of the head media or contribute to the problem of switching from uncontrolled current levels and result in sporadic bit placement in the bit cells.

One way of implementing the resistive impedance is obtained either through the use of capacitors or using MOS transistors in the linear region in series with a resistor across the write driver output. However, this resistive impedance makes the damping circuit vulnerable to IC process variations. In addition, since this type of damping circuit is active throughout the entire duration of the current transition through the head, it dampens the write circuit waveform during the whole duration of the current transition which can limit high-frequency performance. The prior art fails to show a damping circuit which comes into operation only after the current through the head has been switched and, additionally, which has a low process sensitivity.

FIG. 1 illustrates a damping circuit to dampen the write current waveform. When the current switches from the current source transistor 110 to the current source transistor 108, the voltage at node 2 falls to the negative rail and subsequently rises to the DC value. During the transition, feedback through the capacitor 120 causes low resistive impedance to appear at node 2. This low resistive impedance facilitates the damping characteristics. However, the voltage at node 2 rises slowly because of the loading of the low impedance, and since the rate of change of voltage across the head is directly related to the rate of change of slope of the write current, the settling time and rise/fall times will be negatively affected by this approach.

FIG. 2 illustrates another circuit for damping the write current waveform. In this approach, a programmable resistor is added in parallel to the inductive head. The resistor is programmed to have a high value during the rise time and the overshoot time of the write current waveform and have a lower value subsequently. This damping circuit does not come into operation during the rise and overshoot periods. However, this approach may be sensitive to process variations, namely temperature and power supply variations, as the value of the resistor depends heavily on these conditions. Furthermore, such a technique limits the current accuracy through the inductive head since the resistor shunts a portion of the current away from the head.

SUMMARY OF THE INVENTION

An active damping assembly is provided for a disk drive write circuit that includes an active damping circuit, a biasing circuit that is used to trigger the active damping circuit that is used in connection with an inductive load of an H-bridge circuit.

DETAILED DESCRIPTION OF THE PRESENT INVENTION

The following invention is described with reference to figures in which similar or the same numbers represent the same or similar elements. While the invention is described in terms for achieving the invention's objectives, it can be appreciated by those skilled in the art that variations may be accomplished in view of these teachings without deviation from the spirit or scope of the invention.

Figure 10:
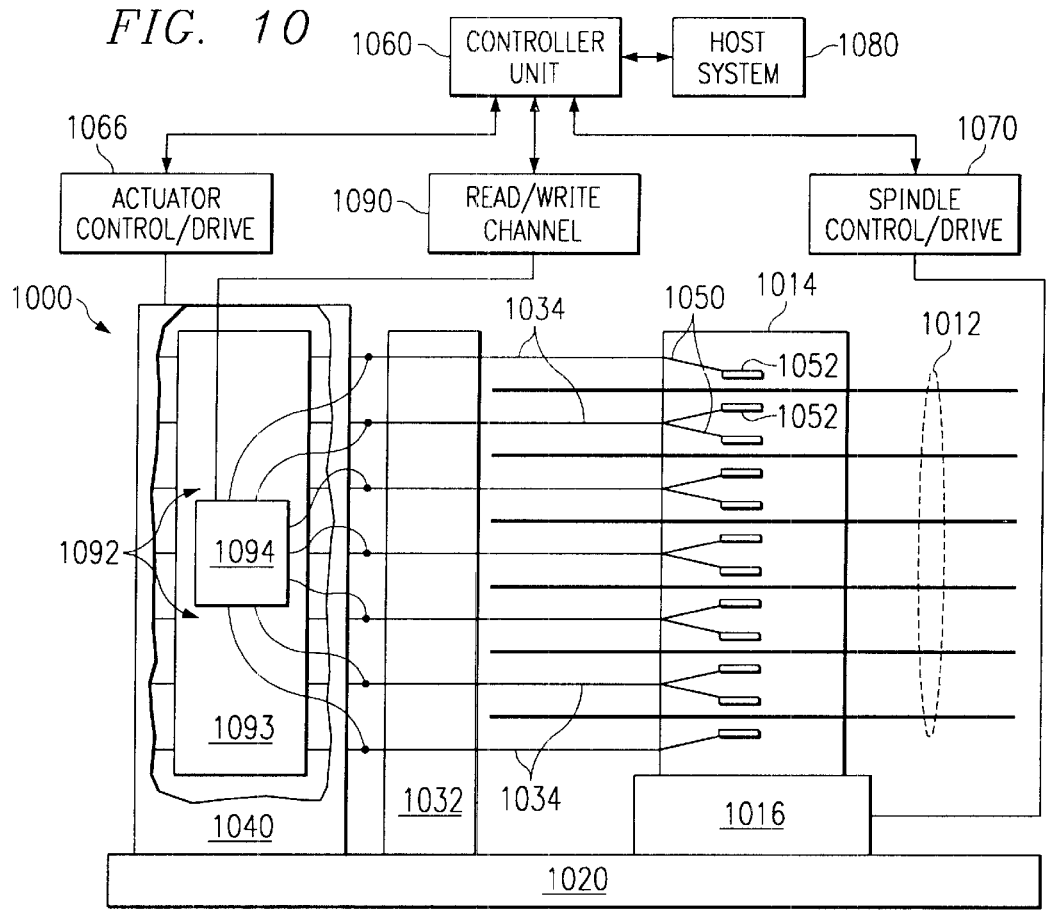
FIG. 10 illustrates a side view of a system with the present invention.
Figure 11:
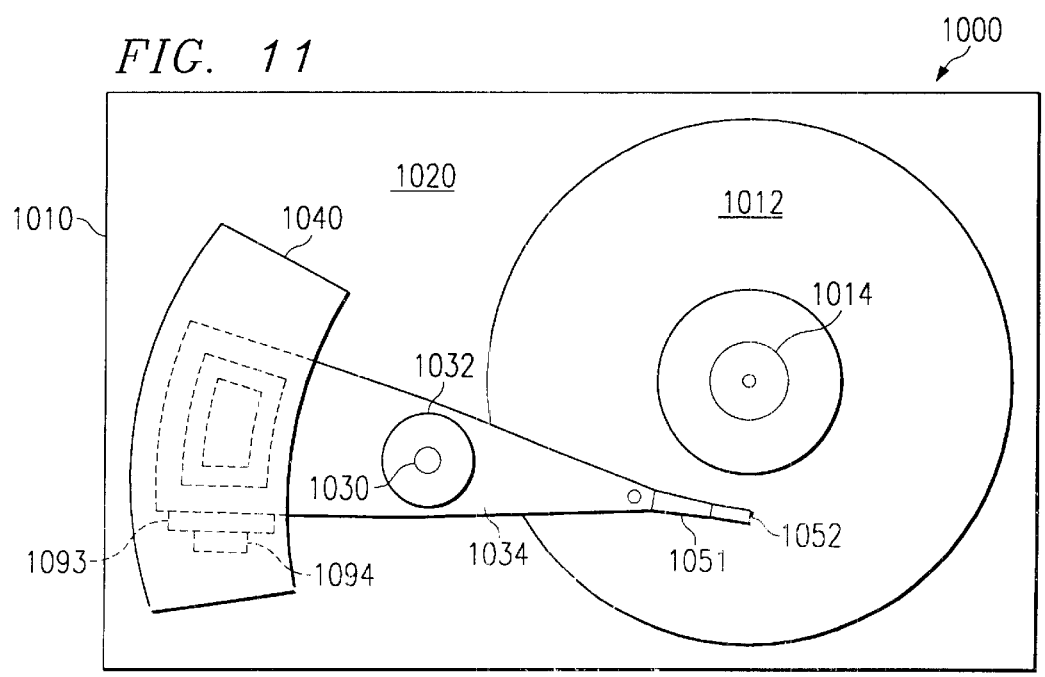
FIG. 11 illustrates a top view of the same system.

FIGS. 10 and 11 show a side and top view, respectively, of the disk drive system designated by the general reference 1000 within an enclosure 1010. The disk drive system 1000 includes a plurality of stacked magnetic recording disks 1012 mounted to a spindle 1014. The disks 1012 may be conventional particulate or thin film recording disk or, in other embodiments, they may be liquid-bearing disks. The spindle 1014 is attached to a spindle motor 1016 which rotates the spindle 1014 and disks 1012. A chassis 1020 is connected to the enclosure 1010, providing stable mechanical is support for the disk drive system. The spindle motor 1016 and the actuator shaft 1030 are attached to the chassis 1020. A hub assembly 1032 rotates about the actuator shaft 1030 and supports a plurality of actuator arms 1034. The stack of actuator arms 1034 is sometimes referred to as a "comb." A rotary voice coil motor 1040 is attached to chassis 1020 and to a rear portion of the actuator arms 1034.

A plurality of head suspension assemblies 1050 are attached to the actuator arms 1034. A plurality of inductive transducer heads 1052 are attached respectively to the suspension assemblies 1050, each head 1052 including at least one inductive write element. In addition thereto, each head 1052 may also include an inductive read element or a MR (magneto-resistive) read element. The heads 1052 are positioned proximate to the disks 1012 by the suspension assemblies 1050 so that during operation, the heads are in electromagnetic communication with the disks 1012. The rotary voice coil motor 1040 rotates the actuator arms 1034 about the actuator shaft 1030 in order to move the head suspension assemblies 1050 to the desired radial position on disks 1012.

A controller unit 1060 provides overall control to the disk drive system 1000, including rotation control of the disks 1012 and position control of the heads 1052. The controller unit 1060 typically includes (not shown) a central processing unit (CPU), a memory unit and other digital circuitry, although it should be apparent that these aspects could also be enabled as hardware logic by one skilled in the computer arts. Controller unit 1060 is connected to the actuator control/drive unit 1066 which is in turn connected to the rotary voice coil motor 1040. A host system 1080, typically a computer system or personal computer (PC), is connected to the controller unit 1060. The host system 1080 may send digital data to the controller unit 1060 to be stored on the disks, or it may request that digital data at a specified location be read from the disks 1012 and sent back to the host system 1080. A read/write channel 1090 is coupled to receive and condition read and write signals generated by the controller unit 1060 and communicate them to an arm electronics (AE) unit shown generally at 1092 through a cut-away portion of the voice coil motor 1040. The AE unit 1092 includes a printed circuit board 1093, or a flexible carrier, mounted on the actuator arms 1034 or in close proximity thereto, and an AE module 1094 mounted on the printed circuit board 1093 or carrier that comprises circuitry preferably implemented in an integrated circuit (IC) chip including read drivers, write drivers, and associated control circuitry. The AE module 1094 is coupled via connections in the printed circuit board to the read/write channel 1090 and also to each read head and each write head in the plurality of heads 1052. The AE module 1094 includes the write circuit of the present invention.

Figure 1:
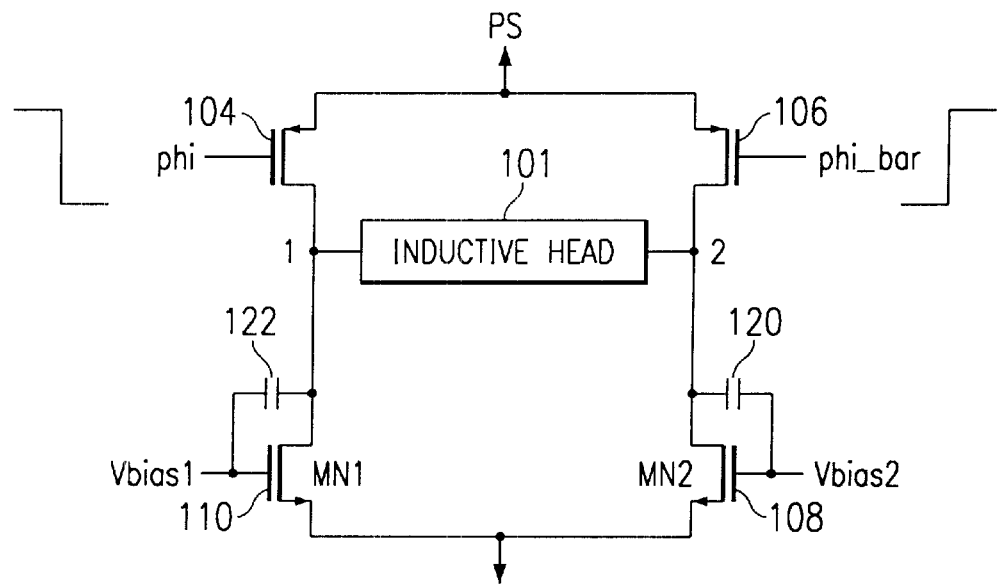
FIG. 1 illustrates a write circuit.
Figure 2:
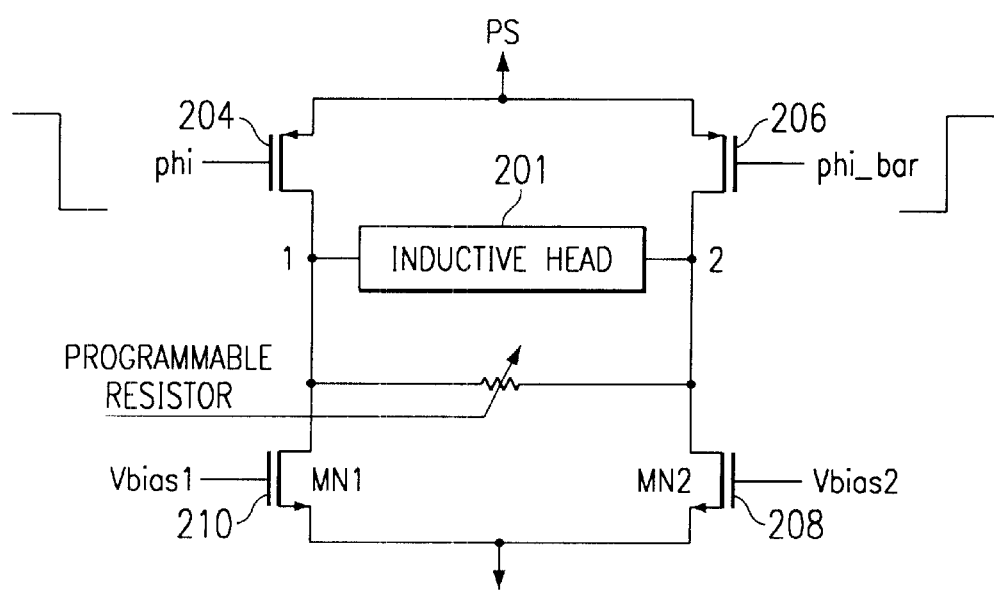
FIG. 2 illustrates another write circuit.
Figure 3:
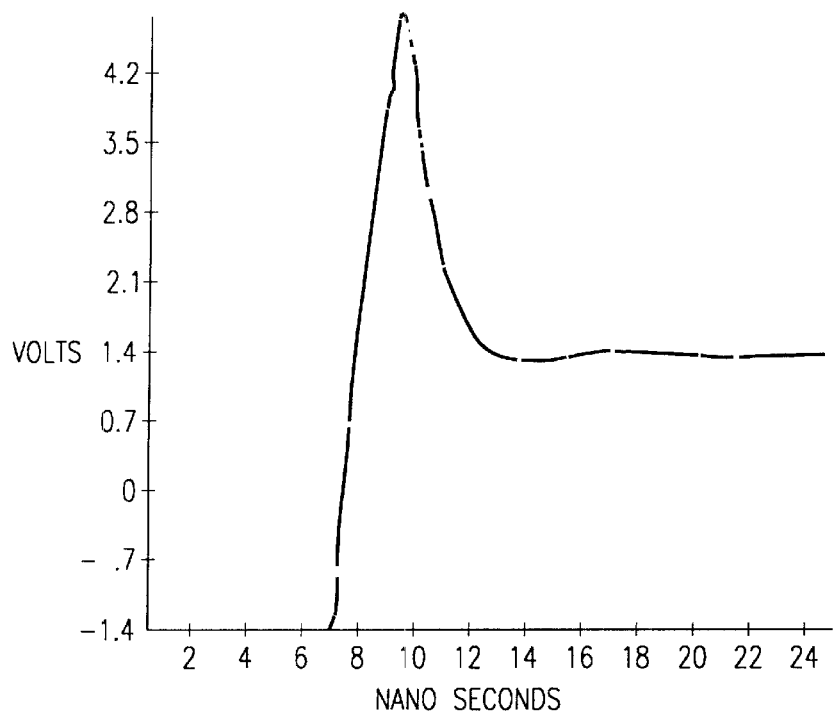
FIG. 3 illustrates a waveform of desired current.
Figure 4:
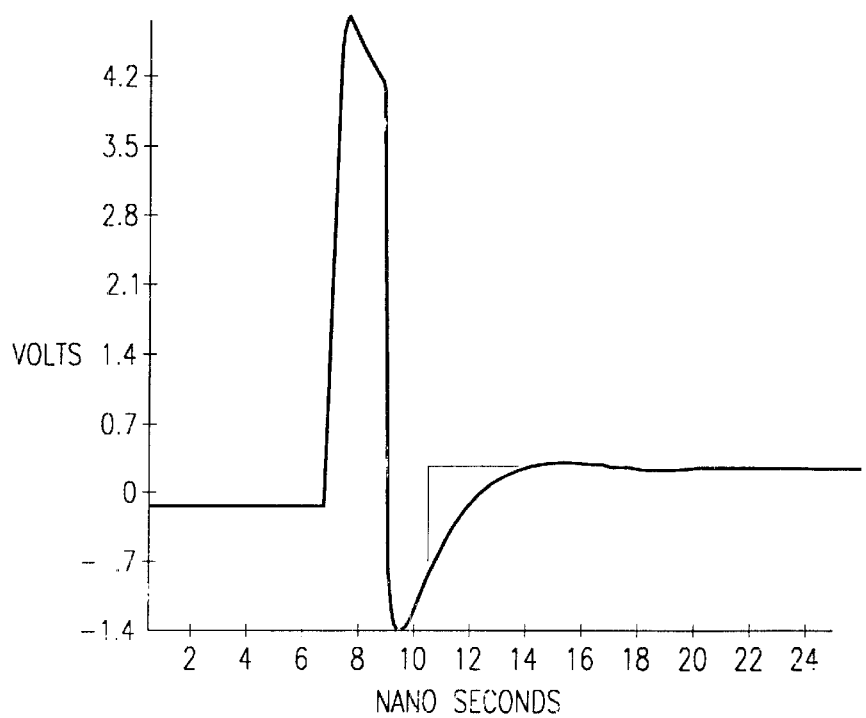
FIG. 4 illustrates a waveform of differential head voltage.
Figure 5:
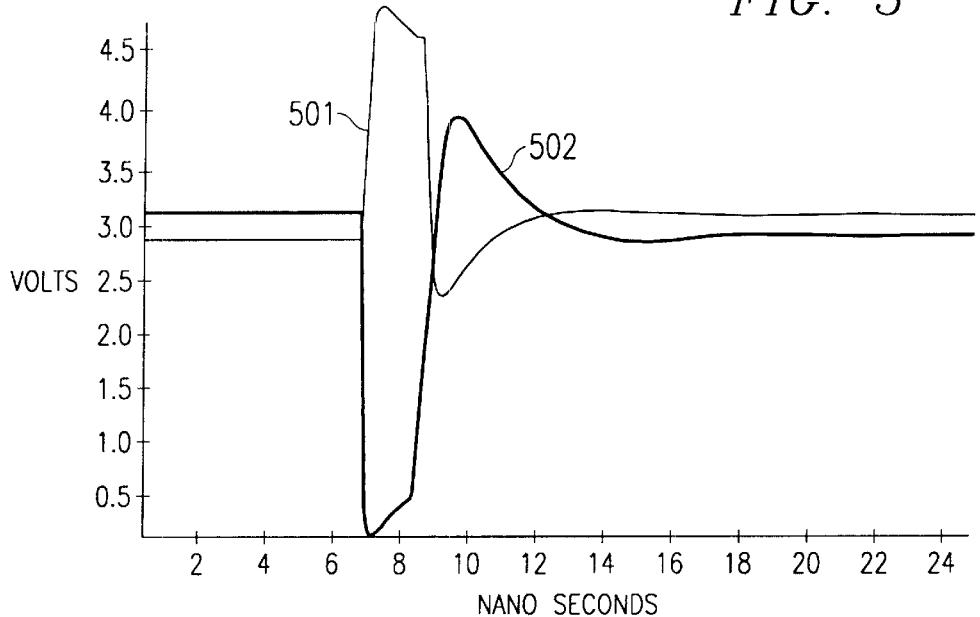
FIG. 5 illustrates a single-ended head voltage waveform.

As discussed above, the electronic circuitry used to drive current through an HDD write head typically uses an H-bridge circuit. FIG. 3 illustrates a desired or ideal write current waveform for a write circuit. As illustrated, the current rises rapidly to a peak current as a result of the inductive nature of the head. As time increases, the current decreases until it approaches a steady state level, at which time it settles out and remains at the steady state current. In the ideal situation, the current does not drop below the steady state value nor does it rise again above the steady state value after the steady state value has been reached. The differential voltage waveform is illustrated in FIG. 4. The voltage, while being maintained at a steady state value, rises rapidly and then begins to drop past the steady state value. It rises to the steady state value after a certain period of time. The desired single-end waveforms are illustrated in FIG. 5. The curve 501 corresponds to the voltage at node 1 while the curve 502 corresponds to the voltage at node 2. In order to achieve the waveforms as illustrated in FIG. 5, a low impedance is required to appear at the head after the differential voltage crosses its DC value, and this low impedance should be present until the waveform has settled. The time duration for applying the low impedance to the head is approximately from 9 ns to 14 ns as illustrated in FIG. 5.

Figure 6:
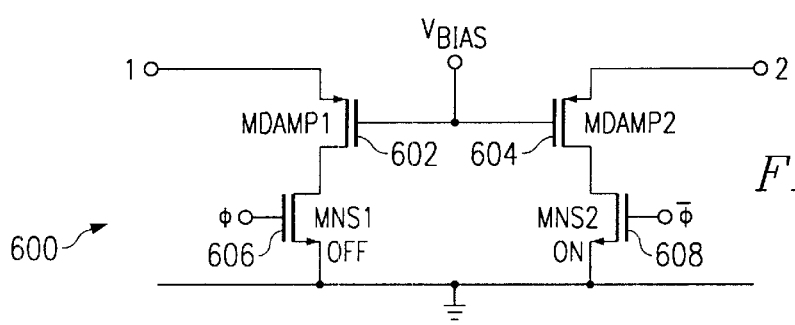
FIG. 6 illustrates an active damping circuit of the present invention.

One low-resistance impedance circuit is illustrated in FIG. 6. Other low impedance circuits could be used equally effectively. FIG. 6 illustrates PMOS transistors in a common gate configuration. However, while PMOS transistors are illustrated, it should be understood that NMOS transistors could achieve equally good results. FIG. 6 illustrates that the source of PFET 602 is connected to terminal 1 with the drain of PFET 602 being connected to the drain of NFET 606. The source of NFET 606 is connected to ground. Likewise, the source of PFET 604 is connected to terminal 2 with the drain of PFET 604 connected to the drain of PFET 608. The gate of PFET 602 is connected to the gate of PFET 604, both of which receive the voltage $V_{BIAS}$. The source of NFET 608 is connected to ground. If the voltage at node 2, $V_2$ is less than the voltage $V_{BIAS}$ plus the turn-on voltage of transistor 604, $V_T$ (aka threshold voltage), then transistor 604 is turned off, and no damping is present. However, if the voltage at node 2, $V_2$ goes above the voltage $V_{BIAS}$ plus the voltage $V_T$, then transistor 604 is turned on, and damping is present. The damping continues until the voltage at node 2, $V_2$ settles to its steady state value, and at the steady state value, transistor 604 should be turned off, and no current should flow through transistor 604. Consequently, the gates of PMOS FET 602 and PFET 608 should be biased at a threshold voltage, $V_T$ below the DC value of the steady state value of the head. NFET 606 and NFET 608 act as switches to turn on and turn off the damping resistors shown as transistors 602 and 604. These NFETs are controlled by signals φ and φ̄. Elements 602, 604, 606 and 608 are numbered elements 702, 704, 706 and 708 is FIG. 7.

Figure 7:
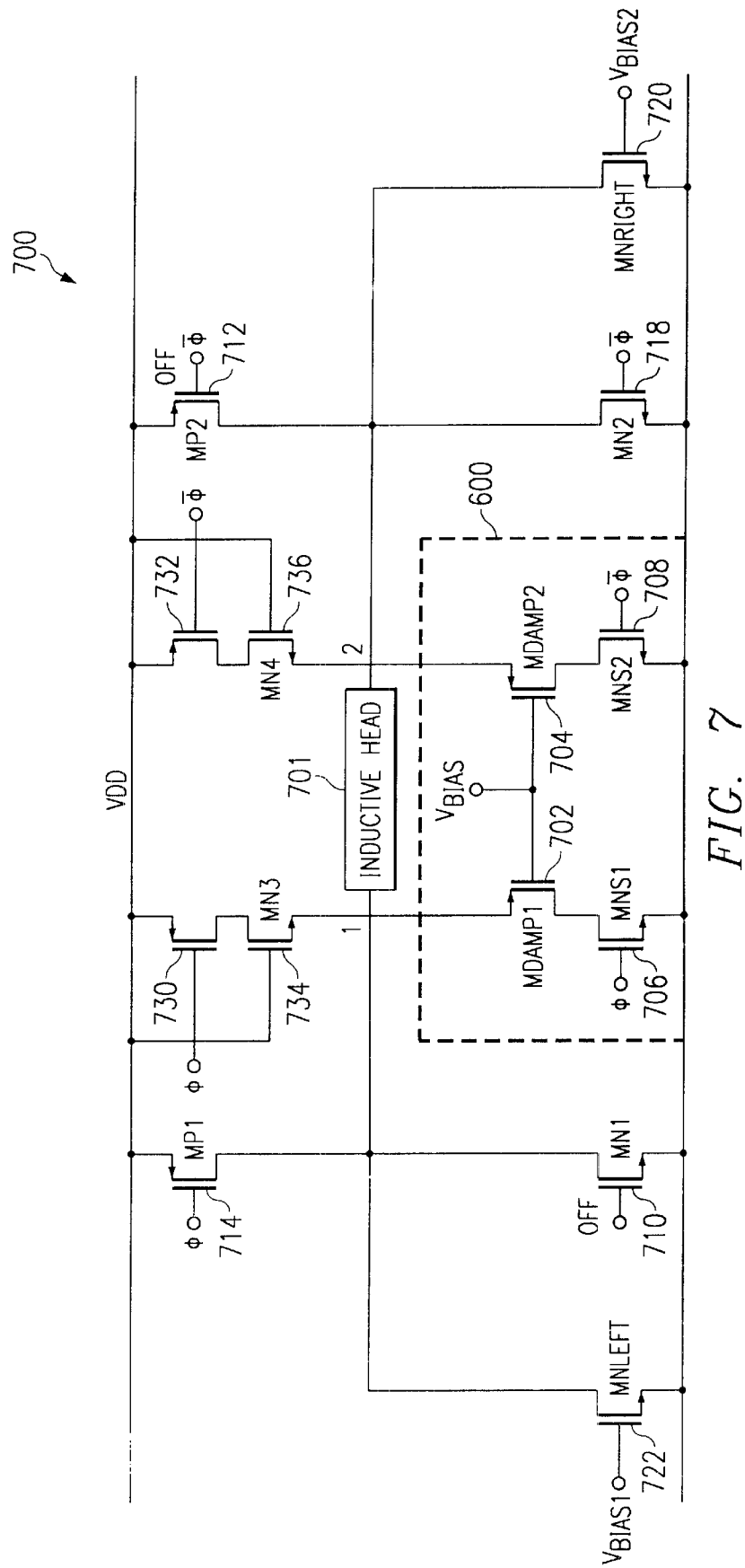
FIG. 7 illustrates a write circuit using the active damping circuit of the present invention.
Figure 9:
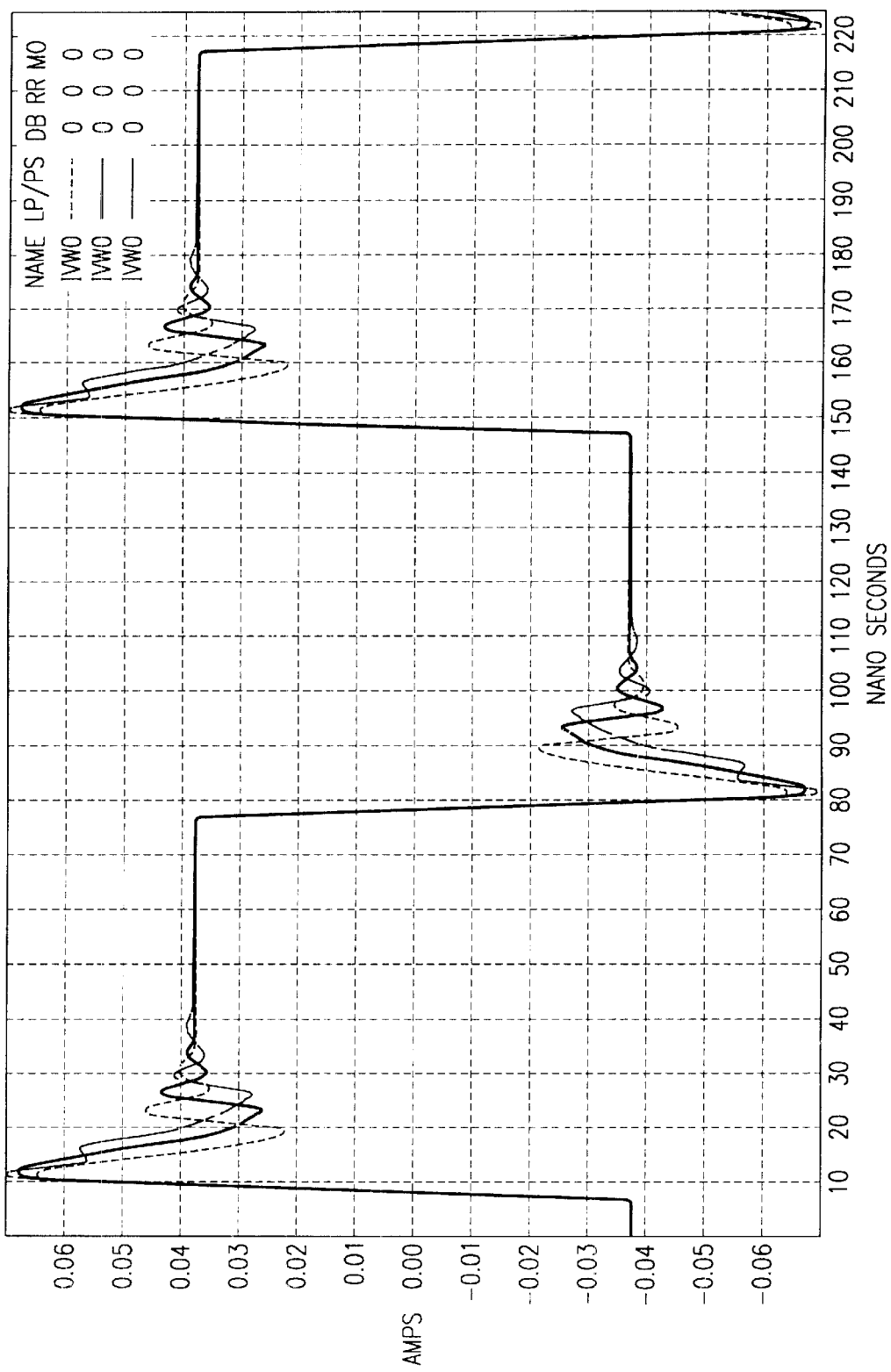
FIG. 9 illustrates a waveform of current.

A schematic for the entire write driver circuit is shown in FIG. 7. FIG. 7 illustrates a switching circuit for the inductive load. The inductive head 701 is connected to terminal 1 and to terminal 2. FETS 702 and 704 are the damping devices shown as a part of the damping circuit 600. For a transition such as shown in FIG. 5, where φ=0V and φ̄=5 v (logic low and high), the transistor 708 is turned on, and transistor 706 is turned off. As discussed above, the electronic circuit used to drive current through an HDD write head typically uses an H-bridge circuit 700 as illustrated in FIG. 7. Typically, the drive driver circuit 700 includes additional circuitry for driving the inputs of the top two and bottom two transistors setting the current value. The purpose of the H-bridge circuit 700 is to allow electric current to be driven through the write head in either direction. When the current is driven in one direction, the north pole of the created magnetic field is in one direction, and when the current is driven in the opposite direction, a magnetic field is created with the north pole in the opposite direction. The magnetic field is then used to "write" data to the disk platter by magnetizing a small region on the disk platter.

The H-bridge circuit 700 operates to switch the drive current through the head by turning on a pair of switches to allow current to flow in a path from a supply source to ground. For example, current flows through the write head from terminal 1 to terminal 2 when the PFET 714 and the NFET 718 are turned on. Although specific types of FETs and bipolar devices are shown for circuit 700, other types of bipolar transistors and FETs could be used in the H-bridge circuit interchangeably. All bipolar transistors could be used, or all FETs could be used, or a mixture of bipolar and FETS could be used. Similarly, current flows in the opposite direction through the write head when PFET 712 and NFET 710 are turned on. The DC operating point of the write head is the voltage at either side of the head when the write current has settled through the head at its desired current setting.

Since the write head is an inductive load, there are voltage and current swings (a characteristic transient ring) at terminal 1 and terminal 2 when the current through the head is reversed rapidly. It is desirable to increase the write frequency of the write head current transition without increasing the ringing period at these write outputs of the write driver.

The source of PFET 714 is connected to voltage $V_{DD}$. The drain of PFET 714 is connected to the drain of NFET 710. The source of NFET 710 is connected to ground. The PFETs 714 and 712 are known as an upper control circuit while the NFETs 710 and 718 are known as the lower control circuit. Additionally, PFET 730 is connected by its source to voltage $V_{DD}$, and the drain of PFET 730 is connected to the drain of NFET 734. The source of NFET 734 is connected to terminal 1. The gate of PFET 730 is connected to receive signal φ while the gate of NFET 734 is connected to voltage $V_{DD}$. Likewise, the source of NFET 736 is connected to terminal 2. The drain of NFET 736 is connected to the drain of PFET 732. The source of PFET 732 is connected to the voltage $V_{DD}$. However, the gate of PFET 732 is connected to receive voltage signal φ̄. The gate of NFET 736 is connected to voltage $V_{DD}$. Additionally, terminal 1 is connected to the drain of NFET 722. An inductive load (the head) is connected between terminal 1 and terminal 2. The source of NFET 722 is connected to ground. Likewise, the drain of NFET 722 is connected to terminal 2, and the source of NFET 722 is connected to ground. Both NFET 720 and NFET 722 are current boost circuits to perform current boost for inductive head 701.

Figure 8:
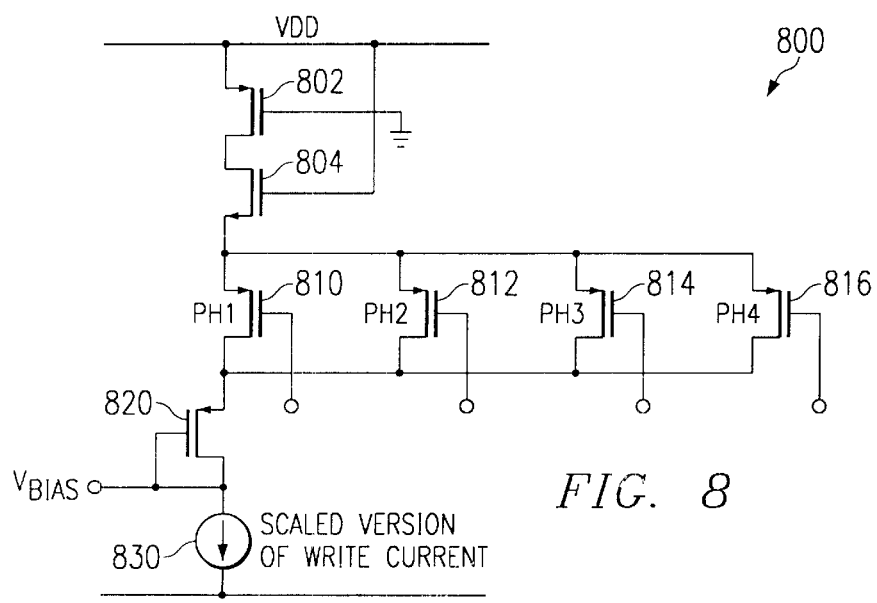
FIG. 8 illustrates a bias network for the active damping circuit of the present invention.

FIG. 8 illustrates the biasing circuit for the damping circuit 600. The biasing circuit 800 generates the biasing voltage $V_{BIAS}$ for the damping circuit 600. This voltage $V_{BIAS}$ is applied to the gates of PFET 702 and PFET 704. PFET 802 includes a source connected to voltage $V_{DD}$, and a drain of transistor 802 is connected to a drain of NFET 804. The gate of transistor 802 is connected to ground while the gate of NFET 804 is connected to voltage $V_{DD}$. The voltage drop across the source to drain of PFET 802 approximately equals the voltage drop across either PFET 730 or PFET 732. The voltage drop across NFET 804 is approximately the same as the voltage drop across NFET 734 or NFET 736. The source of NFET 804 is connected to the sources of PFET 810, PFET 812, PFET 814 or PFET 816. Although four PFETs are shown, any number could be used with the present invention. The drains of PFET 810, PFET 812, PFET 814 and PFET 816 are connected to the source of NFET 820. The gates of PFET 810, PFET 812, PFET 814 and PFET 816 are connected to input pins of the chip or to a to DAC to provide a controlled voltage which tracks the voltage across NFET 710 and NFET 708. The current source 830 is connected to the drain of PFET 820. This bias circuit could be a current mirror to provide a scaled current of the write current through inductive load 701. By placing the circuit of FIG. 8 on the same chip as the circuit of FIG. 7, the problem of process variation can be significantly reduced. By using the same chip, the characteristics which are process dependent will all move in the same direction. Tracking voltage becomes more accurate. Note that the scale and dimensions of all the FETS in this circuit 800 correspond to the scale of current used of the current 700 as described above. The gate of transistor 820 is connected to the drain of transistor 820. This voltage at the gate and drain of transistor 820 is the voltage $V_{BIAS}$ and is input to the gate of transistor 702 and FET 704.

The FETS 710, 712, 714 and 718 initiate the switching of the current through the inductive head 701 and determine the amount of overshoot. For the transition shown in FIG. 5, a negative pulse is applied to the gate of FET 714, and a positive pulse is applied to the gate of FET 718. The DC current through the head is determined through the current source represented by FET 720 and FET 722. The FETS 734 and 736 help in achieving the waveform for the voltage at node 1 by causing a DC drop at voltage $V_1$. The DC value of the voltage at node 2 is a function of power supply, temperature, and processing conditions. Thus, the voltage $V_{BIAS}$ is designed to track the voltage at node 2 in order to reduce process dependency of the damping circuit. Of course, the opposite is true when the head is conducting in the opposite direction.

In order to minimize power dissipation, the current in the biasing network for the damping circuit is scaled to be a smaller version of the actual current in the H-bridge circuit 700. Therefore, the devices in the bias network are scaled to properly match the characteristics of the devices in the H-bridge circuit. This results in the same voltages being generated by the biasing network as the actual H-bridge. The transistors 810, 812, 814 and 816 are used to simulate the resistance of the head. Again, they are a scaled version of the head resistance. Since the voltage drop across the head is small, the damping is not sensitive to variations in head resistance.

The biasing network in FIG. 8 is representative of the topology required to match the type of H-bridge circuit shown in FIG. 7. However, the damping scheme in FIG. 6 is not limited to any type of H-bridge circuit and could be used for different topologies, namely one without FETS 734 and 736.

Although the present invention has been described with reference to particular embodiments, workers skilled in the art will recognize that changes may be made in the details of the invention without departing from the spirit and scope of the invention.

What is claimed is:

1. An active damping circuit, comprising:
   an H-bridge circuit having an inductive load and a switching circuit;
   an impedance circuit responsive to a bias signal to dampen the H-bridge circuit; and
   a bias circuit to generate the bias signal responsive to the voltage drop across said H-bridge circuit.

2. An active damping circuit as in claim 1, wherein said bias signal is responsive to a voltage drop across said inductive head.

3. An active damping circuit as in claim 1, wherein said bias signal is responsive to a voltage drop across said switching circuit.

4. An active damping circuit as in claim 1, wherein said bias signal is based on current responsive to a current through said inductive head.

5. A system for reading and writing information, comprising:
   a disk for storing said information;
   a head including an inductive load for reading and writing said information from/to said disk;
   an H-bridge circuit having said inductive load and a switching circuit;
   an impedance circuit responsive to a bias signal to dampen the H-bridge circuit; and
   a bias circuit to generate the bias signal responsive to the voltage drop across said H-bridge circuit.

6. A system for reading and writing information as in claim 5, wherein said bias signal is responsive to a voltage drop across said inductive head.

7. A system for reading and writing information as in claim 5, wherein said bias signal is responsive to a voltage drop across said switching circuit.

8. A system for reading and writing information as in claim 5, wherein said bias signal is based on current responsive to a current through said inductive head.

* * * * *